US006667497B1

(12) United States Patent
Huang et al.

(10) Patent No.: US 6,667,497 B1
(45) Date of Patent: Dec. 23, 2003

(54) LED PACKAGE

(75) Inventors: Teng-Huei Huang, Hsinchu (TW);
Chuan-Ming Chang, Hsinchu (TW);
Tse-Min Mao, Taipei (TW);
Min-Huang Huang, Yuan Lin Hsien (TW)

(73) Assignee: Advanced Optoelectronic Technology, Hsinchu Hsien (TW)

( * ) Notice: Subject to any disclaimer, the term of this patent is extended or adjusted under 35 U.S.C. 154(b) by 0 days.

(21) Appl. No.: 10/271,532

(22) Filed: Oct. 17, 2002

(30) Foreign Application Priority Data

Jun. 21, 2002 (TW) ........................................ 91113659 A

(51) Int. Cl.⁷ ................................................ H01L 29/72
(52) U.S. Cl. .......................... 257/99; 257/81; 257/84; 257/89; 257/93
(58) Field of Search ................................. 257/432, 433, 257/448, 459, 81, 84, 89, 93, 99

(56) References Cited

U.S. PATENT DOCUMENTS

2002/0149312 A1 * 10/2002 Roberts et al. ............. 257/433

* cited by examiner

Primary Examiner—Edward Wojciechowicz
(74) Attorney, Agent, or Firm—Troxell Law Office PLLC

(57) ABSTRACT

A LED package is comprised of a flat panel base and three LED dies. The flat panel base is composed of a first golden film area, a second golden film area, a third golden film area, a fourth golden film area, a first connection area, and a second connection area, wherein the first connection area and the second connection area are connected to the first golden film area. The first LED die is attached on the flat panel base by flip-chip mounting, wherein an anode of the first LED die is connected to the first golden film area, and a cathode of the first LED die is connected to the second golden film area. The second LED die is attached on the flat panel base by flip-chip mounting, wherein the second LED die is composed of an anode connected to the first golden film area, and a cathode connected to the fourth golden film area. The third LED die is attached on the third golden film area; wherein the third LED die is composed of an anode connected to the first golden film area by a metallic wire, and a cathode connected to the third golden film area.

24 Claims, 2 Drawing Sheets

LED PACKAGE

BACKGROUND OF THE INVENTION

1. Field of Invention

The present invention relates to a packaging design for light emitting diode (LED), more particularly, to a LED package contains three LED dies.

2. Description of Related Art

Light emitting diode (LED) is a junction diode formed by an epitaxial P-type layer and an epitaxial N-type layer on a heavily doped semiconductor compound base. The diode further includes an ohmic metallic contact on the P-type and N-type layers. LED is mainly packaged within an epoxy or a metallic housing. Visible LED are generally used in display screens, automobile braking lights, scanners, indicator lights for equipment and so on.

Surface-mount device LED (SMD LED) was developed in the early 1980s. For assembling SMD LED, the chip is glued or eutectic bonded to a metallic system carrier, what is referred to as a leadframe, namely on a central part or island thereof given standard components or, respectively, standard ICs, and wires are bonded to the chip. The chip is also completely enveloped with a plastic molding compound in an injection molding process such that only the ends of the system carrier serving as outer terminals project therefrom.

SMD LEDs have several of specification, such as 1206M (3.0 mm*1.5 mm*0.7 mm), 1206P (with a size of 3.0 mm*1.5 mm*0.7 mm), 0805M (with a size of 2.0 mm*1.2 mm*0.6 mm), and 0603M (with a size of 1.6 mm*0.8 mm*0.5 mm). Because the 0603M model is especially small in size, only single light emitting diode could be contained in the LED package in accordance with the prior art.

As soon as the rapid development of mobile phones and PDAs (Personal Digital Assistants), there is a request to develop colorful LED panels to display colorful images. Therefore, it is necessary to develop a LED package with three (3) light emitting diodes (generally red, blue, and green).

However, particularly for the smallest 0603M model, the conventional LED package can contain only one die, so it is impossible to generate colorful images. Therefore, in order to display colorful images, it is very important for the LED package industry to create a package assembly containing at least a red, a blue, and a green light emitting diodes.

SUMMARY OF THE INVENTION

It is the main object of the present invention to provide a LED package with three different light emitting diodes (red, blue, and green).

The second object of the present invention is to disclose a LED package.

The third object of the present invention is to provide a method for manufacturing a LED package.

The first embodiment of the present invention discloses a LED package, which is comprised of a flat panel base and three LED dies. The flat panel base is composed of a first golden film area, a second golden film area, a third golden film area, a fourth golden film area, a first connection area, and a second connection area, wherein the first connection area and the second connection area are connected to the first golden film area. The first LED die is attached on the flat panel base by flip-chip mounting, wherein an anode of the first LED die is connected to the first golden film area, and a cathode of the first LED die is connected to the second golden film area. The second LED die is attached on the flat panel base by flip-chip mounting, wherein the second LED die is composed of an anode connected to the first golden film area, and a cathode connected to the fourth golden film area. The third LED die is attached on the third golden film area; wherein the third LED die is composed of an anode connected to the first golden film area by a metallic wire, and a cathode connected to the third golden film area.

The second embodiment of the present invention discloses a LED package, which is comprised of a flat panel base and three LED dies. The flat panel base is composed of a first golden film area, a second golden film area, a third golden film area, a fourth golden film area, a first connection area, and a second connection area, wherein the first connection area and the second connection area are connected to the first golden film area. The first LED die is attached on the flat panel base by flip-chip mounting, wherein a cathode of the first LED die is connected to the first golden film area, and an anode of the first LED die is connected to the second golden film area. The second LED die is attached on the flat panel base by flip-chip mounting, wherein the second LED die is composed of a cathode connected to the first golden film area, and an anode connected to the fourth golden film area. The third LED die is attached on the third golden film area; wherein the third LED die is composed of a cathode connected to the first golden film area by a metallic wire, and an anode connected to the third golden film area.

The process flow of the method of manufacturing a LED package according to the present invention is also disclosed. A flat panel base is first provided. Thereafter, the first golden film area, the second golden film area, the third golden film area, the fourth golden film area, the first connection area, and the second connection area are formed on the flat panel base. After that, the first LED die, the second LED die, and the third LED die are attached on the flat panel base by means of silver glue.

Next, the anode or cathode of the third LED die is connected to the common anode or common cathode of the LED package by wire bonding.

Thereafter, a PCB is formed by using a glue plate and a mold, and then the PCB is cut by using a cutter. Finally, a step of classification is performed by inputting a stable current into the LED package.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically illustrates the top-view diagram of the LED package according to the first embodiment of the present invention.

DESCRIPTION OF THE PREFERRED EMBODIMENTS

The present invention relates to a packaging design for light emitting diode (LED), more particularly, to a LED package contains three LED dies.

Figure 1:
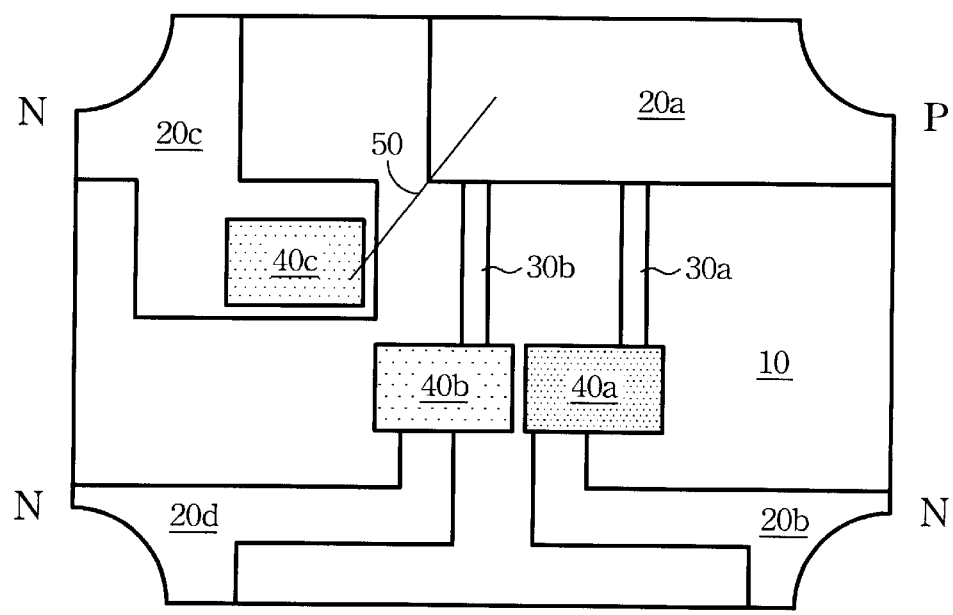

First please refer to FIG. 1, which schematically illustrates the top-view diagram of the LED package according to the first embodiment of the present invention. The LED package is composed of a flat panel base 10, the first LED die 40a, the second LED die 40b, and the third LED die 40c.

The flat panel base 10 is composed of a first golden film area 20a, a second golden film area 20b, a third golden film area 20c, a fourth golden film area 20d, a first connection area 30a, and a second connection area 30b. The first connection area 30a and the second connection area 30b are connected to the first golden film area 20a.

The first golden film area 20a serves as the common anode of the LED package. The second golden film area 20b serves as the cathode for blue color of the LED package. The third golden film area 20c works as the cathode for green color of the LED package. The fourth film area 20d works as the cathode for the red color of the LED package.

The first LED die 40a is a blue-colored light emitting diode manufactured from InGaN. The first LED die 40a is attached on the flat panel base 10 by flip-chip mounting. The anode of the first LED die 40a is connected to the first connection area 30a and then to the first golden film area 20a. The cathode of the first LED die 40a is connected to the second golden film area 20b.

The second LED die 40b is a green-colored light emitting diode manufactured from InGaN. The second LED die 40b is attached on the flat panel base 10 by flip-chip mounting. The anode of the second LED die 40b is connected to the second connection area 30b, and then to the first golden film area 20a. The cathode of the second LED die 40b is connected to the fourth golden film area 20d.

The third LED die 40c is a red-colored light emitting diode attached on the third golden film area 20c. The anode of the third LED die 40c is connected to the first golden film area 20a by a metallic wire 50. The cathode of the third LED die 40c is connected to the third golden film area 20c.

According to a preferred embodiment of the present invention, the LED package can specially be a 0603 model package.

Figure 2:
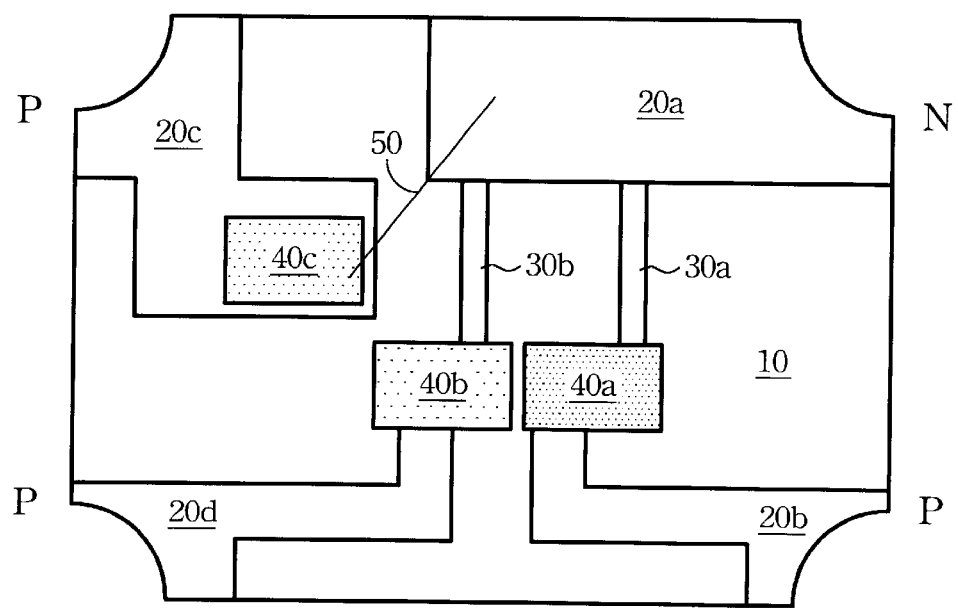
FIG. 2 schematically illustrates the top-view diagram of the LED package according to the second embodiment of the present invention.

Please then to FIG. 2, which schematically illustrates the top-view diagram of the LED package according to the second embodiment of the present invention. The LED package is composed of a flat panel base 10, the first LED die 40a, the second LED die 40b, and the third LED die 40c.

The flat panel base 10 is composed of a first golden film area 20a, a second golden film area 20b, a third golden film area 20c, a fourth golden film area 20d, a first connection area 30a, and a second connection area 30b. The first connection area 30a and the second connection area 30b are connected to the first golden film area 20a.

The first golden film area 20a serves as the common cathode of the LED package. The second golden film area 20b serves as the anode for blue color of the LED package. The third golden film area 20c works as the anode for green color of the LED package. The fourth film area 20d works as the anode for the red color of the LED package.

The first LED die 40a is a blue-colored light emitting diode manufactured from InGaN. The first LED die 40a is attached on the flat panel base 10 by flip-chip mounting. The cathode of the first LED die 40a is connected to the first connection area 30a and then to the first golden film area 20a. The anode of the first LED die 40a is connected to the second golden film area 20b.

The second LED die 40b is a green-colored light emitting diode manufactured from InGaN. The second LED die 40b is attached on the flat panel base 10 by flip-chip mounting. The cathode of the second LED die 40b is connected to the second connection area 30b, and then to the first golden film area 20a. The anode of the second LED die 40b is connected to the fourth golden film area 20d.

The third LED die 40c is a red-colored light emitting diode attached on the third golden film area 20c. The cathode of the third LED die 40c is connected to the first golden film area 20a by a metallic wire 50. The anode of the third LED die 40c is connected to the third golden film area 20c.

According to a preferred embodiment of the present invention, the LED package can specially be a 0603 model package.

Figure 3:
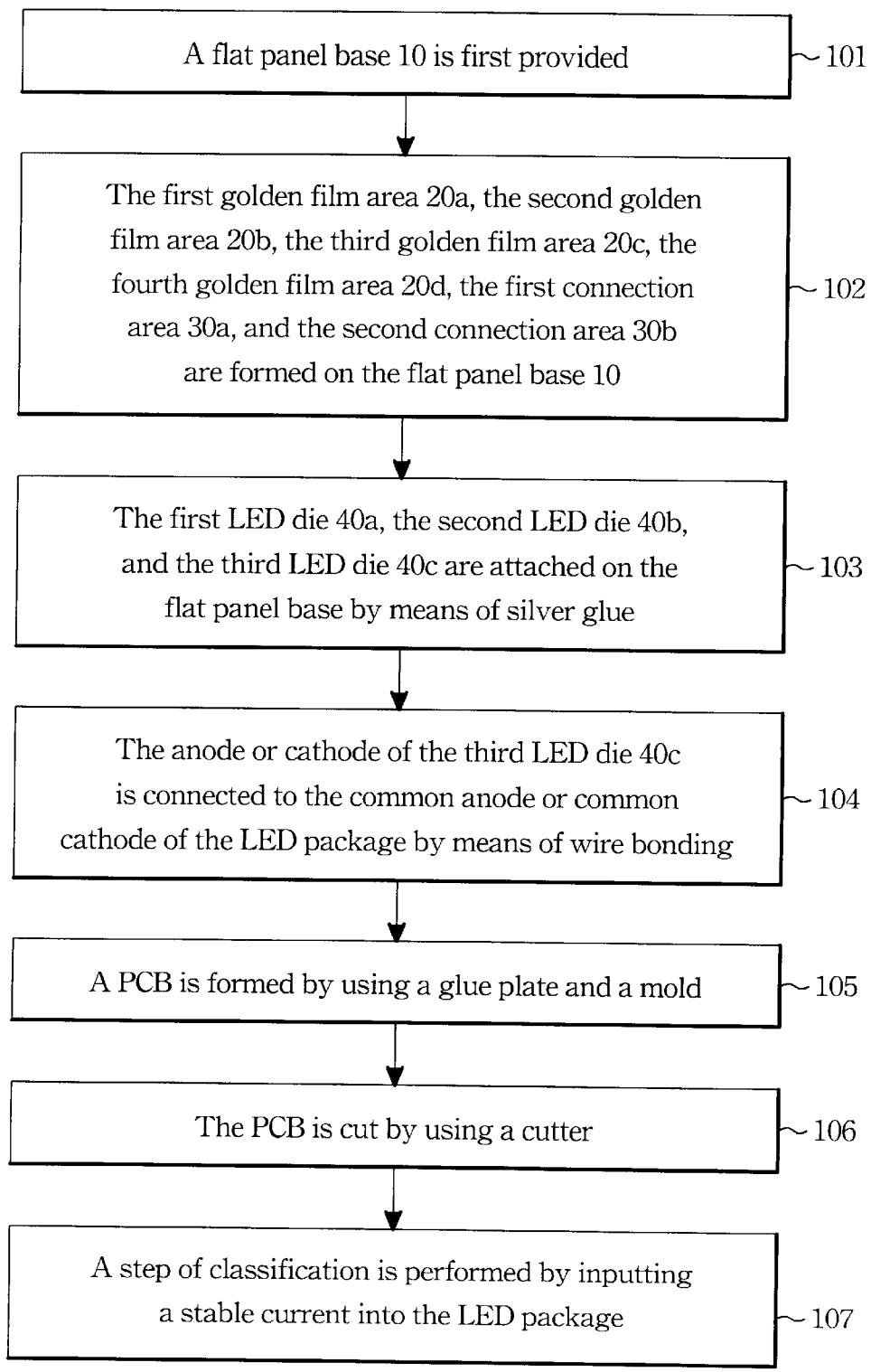
FIG. 3 discloses the process flow of the method of manufacturing a LED package according to the present invention.

Referring then to FIG. 3, the process flow of the method of manufacturing a LED package according to the present invention is disclosed. A flat panel base 10 is first provided (step 101). Thereafter, the first golden film area 20a, the second golden film area 20b, the third golden film area 20c, the fourth golden film area 20d, the first connection area 30a, and the second connection area 30b are formed on the flat panel base 10 (step 102). After that, the first LED die 40a, the second LED die 40b, and the third LED die 40c are attached on the flat panel base by means of silver glue (step 103).

Next, the anode or cathode of the third LED die 40c is connected to the common anode or common cathode of the LED package by means of wire bonding (step 104).

Thereafter, a PCB is formed by using a glue plate and a mold (step 105), and then the PCB is cut by using a cutter (step 106). Finally, a step of classification is performed by inputting a stable current into the LED package (step 107).

While the present invention has been described with the reference to a preferred embodiment thereof, those skilled in the art will appreciate various changes in form and detail may be made without departing from the intended scope of the present invention as defined in the appended claims.

What is claimed is:

1. A LED package comprising:
    a flat panel base, which is composed of a first golden film area, a second golden film area, a third golden film area, a fourth golden film area, a first connection area, and a second connection area, wherein said first connection area and said second connection area are connected to said first golden film area;
    a first LED die attached on said flat panel base by flip-chip mounting, wherein an anode of said first LED die is connected to said first connection area and then to said first golden film area, and a cathode of said first LED die is connected to said second golden film area;
    a second LED die attached on said flat panel base by flip-chip mounting, wherein said second LED die is composed of an anode connected to said second connection area and then to said first golden film area, and a cathode connected to said fourth golden film area;
    a third LED die attached on said third golden film area; wherein said third LED die is composed of an anode connected to said first golden film area by a metallic wire, and a cathode connected to said third golden film area.

2. The LED package of claim 1, wherein said LED package is a 0603 model package.

3. The LED package of claim 1, wherein said first LED die, said second LED die, and said third LED die are attached on said flat panel base by means of silver glue.

4. The LED package of claim 1, wherein said first golden film area serves as a common anode of said LED package.

5. The LED package of claim 1, wherein said first LED die is a blue-colored light emitting diode manufactured from InGaN.

6. The LED package of claim 1, wherein said second golden film area serves as a cathode for blue color of the LED package.

7. The LED package of claim 1, wherein said second LED die is a green-colored light emitting diode manufactured from InGaN.

8. The LED package of claim 1, wherein said third golden film area serves as a cathode for green color of the LED package.

9. The LED package of claim 1, wherein said second LED die is a red-colored light emitting diode.

10. The LED package of claim 1, wherein said fourth golden film area serves as a cathode for red color of the LED package.

11. A LED package comprising:
   a flat panel base, which is composed of a first golden film area, a second golden film area, a third golden film area, a fourth golden film area, a first connection area, and a second connection area, wherein said first connection area and said second connection area are connected to said first golden film area;
   a first LED die attached on said flat panel base by flip-chip mounting, wherein a cathode of said first LED die is connected to said first connection area and then to said first golden film area, and an anode of said first LED die is connected to said second golden film area;
   a second LED die attached on said flat panel base by flip-chip mounting, wherein said second LED die is composed of a cathode connected to said second connection area and then to said first golden film area, and an anode connected to said fourth golden film area;
   a third LED die attached on said third golden film area; wherein said third LED die is composed of a cathode connected to said first golden film area by a metallic wire, and an anode connected to said third golden film area.

12. The LED package of claim 11, wherein said LED package is a 0603 model package.

13. The LED package of claim 11, wherein said first LED die, said second LED die, and said third LED die are attached on said flat panel base by means of silver glue.

14. The LED package of claim 11, wherein said first golden film area serves as common cathode of said LED package.

15. The LED package of claim 11, wherein said first LED die is a blue-colored light emitting diode manufactured from InGaN.

16. The LED package of claim 11, wherein said second golden film area serves as an anode for blue color of the LED package.

17. The LED package of claim 11, wherein said second LED die is a green-colored light emitting diode manufactured from InGaN.

18. The LED package of claim 11, wherein said third golden film area serves as an anode for green color of the LED package.

19. The LED package of claim 11, wherein said second LED die is a red-colored light emitting diode.

20. The LED package of claim 11, wherein said fourth golden film area serves as an anode for red color of the LED package.

21. A method of forming a LED package, comprising:
   providing a flat panel base;
   forming a first golden film area, a second golden film area, a third golden film area, a fourth golden film area, a first connection area, and a second connection area on said flat panel base;
   attaching a first LED die, a second LED die, and a third LED die on said flat panel base by using silver glue; and
   wire-bonding an electrode of a third LED die to a common electrode of said LED package.

22. A method of claim 21, further comprising a step of forming a PCB by using a glue plate and a mold.

23. A method of claim 21, further comprising a step of cutting a PCB by using a cutter.

24. A method of claim 21, further comprising a step of performing a step of classification by inputting a stable current into the LED package.

* * * * *